US00RE43510E

(19) United States
(12) Reissued Patent
Adriaenssens et al.

(10) Patent Number: US RE43,510 E
(45) Date of Reissued Patent: *Jul. 17, 2012

(54) NEXT HIGH FREQUENCY IMPROVEMENT USING HYBRID SUBSTRATES OF TWO MATERIALS WITH DIFFERENT DIELECTRIC CONSTANT FREQUENCY SLOPES

(75) Inventors: Luc Adriaenssens, Frisco, TX (US); Amid Hashim, Plano, TX (US); Troy Long, Omaha, NE (US)

(73) Assignee: CommScope, Inc. of North Carolina, Hickory, NC (US)

( * ) Notice: This patent is subject to a terminal disclaimer.

(21) Appl. No.: 12/793,052

(22) Filed: Jun. 3, 2010

Related U.S. Patent Documents

Reissue of:
(64) Patent No.: 7,459,640
Issued: Dec. 2, 2008
Appl. No.: 11/734,263
Filed: Apr. 11, 2007

U.S. Applications:
(63) Continuation of application No. 10/800,696, filed on Mar. 16, 2004, now Pat. No. 7,265,300.

(60) Provisional application No. 60/456,236, filed on Mar. 21, 2003.

(51) Int. Cl.
*H05K 1/00* (2006.01)

(52) U.S. Cl. ..... 174/258; 361/766

(58) Field of Classification Search ..... 174/258–250, 174/255, 261; 361/777, 782, 766; 439/941, 439/676, 404, 418, 188; 333/1, 12, 35, 165, 333/185

See application file for complete search history.

(56) References Cited

U.S. PATENT DOCUMENTS

| | | | |
|---|---|---|---|
| 5,396,397 | A | 3/1995 | McClanahan et al. |
| 5,700,167 | A | 12/1997 | Pharney et al. |
| 5,915,989 | A | 6/1999 | Adriaenssens et al. |
| 5,931,703 | A | 8/1999 | Aekins |
| 5,997,358 | A | 12/1999 | Adriaenssens et al. |
| 6,042,427 | A | 3/2000 | Adriaenssens et al. |
| 6,050,843 | A | 4/2000 | Adriaenssens et al. |
| 6,057,743 | A | 5/2000 | Aekin et al. |
| 6,089,923 | A | 7/2000 | Phommachanh |
| 6,165,018 | A | 12/2000 | Arnett et al. |
| 6,168,474 | B1 | 1/2001 | German et al. |

(Continued)

FOREIGN PATENT DOCUMENTS

EP 1 059 704 A2 12/2000

(Continued)

OTHER PUBLICATIONS

Ragu Natarajan and J.P. Dougherty, "Material Compatibility and Dielectric Properties of Co-Fired High and Low Dielectric Constant Ceramic Packages," IEEE 1997 Electronic Components and Technology Conference.

(Continued)

*Primary Examiner* — Yuriy Semenenko
(74) *Attorney, Agent, or Firm* — Myers Bigel Sibley & Sajovec

(57) ABSTRACT

A connector is provided for simultaneously improving both the NEXT high frequency performance when low crosstalk plugs are used and the NEXT low frequency performance when high crosstalk plugs are used. The connector includes PCB substrates made of materials having different dielectric frequency characteristics.

52 Claims, 8 Drawing Sheets

U.S. PATENT DOCUMENTS

| | | | | |
|---|---|---|---|---|
| 6,215,372 | B1 | 4/2001 | Novak | |
| 6,250,968 | B1 | 6/2001 | Winings | |
| 6,270,381 | B1 | 8/2001 | Adriaenssens et al. | |
| 6,346,010 | B1 | 2/2002 | Emplit | |
| 6,353,540 | B1 | 3/2002 | Narizuka et al. | |
| 6,356,162 | B1 | 3/2002 | DeFlandre et al. | |
| 6,379,157 | B1 * | 4/2002 | Curry et al. | 439/676 |
| 6,402,560 | B1 * | 6/2002 | Lin | 439/676 |
| 6,428,362 | B1 | 8/2002 | Phommachanh | |
| 6,441,314 | B2 | 8/2002 | Rokugawa et al. | |
| 6,483,715 | B1 | 11/2002 | Chen | |
| 6,509,779 | B2 | 1/2003 | Yue et al. | |
| 6,528,145 | B1 | 3/2003 | Berger et al. | |
| 6,533,618 | B1 | 3/2003 | Aekins | |
| 6,538,210 | B2 | 3/2003 | Sugaya et al. | |
| 6,563,058 | B2 | 5/2003 | Mizutani et al. | |
| 6,603,668 | B2 | 8/2003 | Iwanami | |
| 6,663,946 | B2 | 12/2003 | Seri et al. | |
| 6,678,144 | B2 | 1/2004 | Higashi et al. | |
| RE38,519 | E | 5/2004 | Doorhy et al. | |
| 6,734,542 | B2 | 5/2004 | Nakatani et al. | |
| 6,799,989 | B2 | 10/2004 | Doorhy et al. | |
| 6,865,090 | B2 | 3/2005 | Wajima et al. | |
| 6,866,548 | B2 | 3/2005 | Hashim | |
| 6,923,673 | B2 | 8/2005 | Doorhy et al. | |
| 6,972,893 | B2 | 12/2005 | Chen et al. | |
| 6,984,886 | B2 | 1/2006 | Ahn et al. | |
| 7,013,561 | B2 | 3/2006 | Nakatani et al. | |
| 7,114,985 | B2 | 10/2006 | Doorhy et al. | |
| 7,153,168 | B2 | 12/2006 | Caveney et al. | |
| 7,154,049 | B2 | 12/2006 | Celella et al. | |
| 7,179,131 | B2 | 2/2007 | Caveney et al. | |
| 7,182,649 | B2 | 2/2007 | Caveney et al. | |
| 7,190,594 | B2 * | 3/2007 | Hashim et al. | 361/777 |
| 7,252,554 | B2 | 8/2007 | Caveney et al. | |
| 7,265,300 | B2 | 9/2007 | Adriaenssens et al. | |
| 7,309,261 | B2 | 12/2007 | Caveney et al. | |
| 7,317,318 | B2 | 1/2008 | Jackson | |
| 7,384,315 | B2 | 6/2008 | Caveney et al. | |
| 7,410,367 | B2 | 8/2008 | Hashim et al. | |
| 7,442,092 | B2 | 10/2008 | Caveney et al. | |
| 7,481,681 | B2 | 1/2009 | Caveney et al. | |
| 7,520,784 | B2 | 4/2009 | Caveney et al. | |
| 7,591,689 | B2 | 9/2009 | Caveney et al. | |
| 7,736,195 | B1 * | 6/2010 | Poulsen et al. | 439/676 |
| 2001/0048592 | A1 * | 12/2001 | Ninomiya | 361/780 |
| 2002/0088977 | A1 | 7/2002 | Mori et al. | |
| 2002/0195270 | A1 | 12/2002 | Okubora et al. | |
| 2003/0024732 | A1 | 2/2003 | Ninomiya | |
| 2003/0075356 | A1 | 4/2003 | Horie | |
| 2003/0119372 | A1 | 6/2003 | Aekins | |
| 2003/0174484 | A1 | 9/2003 | Pai et al. | |
| 2003/0218870 | A1 | 11/2003 | Fisher et al. | |
| 2004/0040740 | A1 | 3/2004 | Nakatani et al. | |
| 2004/0082227 | A1 | 4/2004 | Hashim et al. | |
| 2004/0147165 | A1 | 7/2004 | Celella et al. | |
| 2004/0184247 | A1 | 9/2004 | Adriaenssens et al. | |
| 2005/0199422 | A1 | 9/2005 | Hashim et al. | |
| 2005/0239340 | A1 | 10/2005 | Jackson | |
| 2005/0254223 | A1 | 11/2005 | Hashim et al. | |
| 2006/0154531 | A1 | 7/2006 | Kim et al. | |
| 2006/0160428 | A1 | 7/2006 | Hashim | |
| 2007/0117469 | A1 | 5/2007 | Caveney et al. | |
| 2007/0123112 | A1 | 5/2007 | Caveney et al. | |
| 2007/0133185 | A1 | 6/2007 | Hashim et al. | |
| 2007/0173120 | A1 | 7/2007 | Caveney et al. | |
| 2008/0268710 | A1 | 10/2008 | Hashim et al. | |

FOREIGN PATENT DOCUMENTS

| | | | |
|---|---|---|---|
| GB | 2 380 334 | A | 4/2003 |
| GB | 2380334 | * | 4/2003 |
| JP | 2003086305 | A | 3/2003 |
| WO | WO 03/019734 | A1 | 3/2003 |

OTHER PUBLICATIONS

Gary D. Alley, "Interdigital Capacitors and Their Application to Lumped-Element Microwave Integrated Circuits," IEEE Transactions on Microwave Theory and Techniques, 1970, vol. 18, No. 12, p. 1028-1033.

European Search Report for corresponding application No. 05010147.6 dated Jul. 13, 2009.

* cited by examiner

NEXT HIGH FREQUENCY IMPROVEMENT USING HYBRID SUBSTRATES OF TWO MATERIALS WITH DIFFERENT DIELECTRIC CONSTANT FREQUENCY SLOPES

Matter enclosed in heavy brackets [ ] appears in the original patent but forms no part of this reissue specification; matter printed in italics indicates the additions made by reissue.

This application is a continuation of application Ser. No. 10/800,696, filed Mar. 16, 2004, now U.S. Pat. No. 7,265,300, which claims the benefit of U.S. Provisional Application No. 60/456,236, filed on Mar. 21, 2003. The entire contents of both prior applications are herein fully incorporated by reference.

BACKGROUND OF THE INVENTION

1. Field of the Invention

The present invention relates to near-end crosstalk (NEXT) compensation in communication connectors and, more particularly, to a technique of canceling or reducing NEXT utilizing substrates such as printed circuit boards (PCBs) composed of different dielectric constant materials.

2. Discussion of the Related Art

Noise or signal interference between conductors in a connector is known as crosstalk. Crosstalk is a common problem in communication devices using connectors. Particularly, in a communication system where a modular plug often used with a computer is to mate with a modular jack, the electrical wires (conductors) within the jack and/or plug produce near-end crosstalk (NEXT), i.e., a crosstalk over closely-positioned wires over a short distance. A plug, due to its configuration or to the manner in which cordage is terminated to it, can produce a high crosstalk or a low crosstalk. A plug with a high crosstalk is herein referred to as a high crosstalk plug, and a plug with a low crosstalk is herein referred to as a low crosstalk plug.

U.S. Pat. No. 5,997,358 issued to Adriaenssens et al. (hereinafter "the '358 patent") describes a two-stage scheme for compensating such NEXT. The entire contents of the '358 patent are incorporated by reference. Further, the subject matters of U.S. Pat. Nos. 5,915,989; 6,042,427; 6,050,843; and 6,270,381 are also incorporated by reference.

The '358 patent reduces the NEXT (original crosstalk) between the electrical wire pairs of a modular plug by adding a fabricated or artificial crosstalk, usually in the jack, at two stages, thereby canceling the crosstalks or reducing the overall crosstalk for the plug-jack combination. The fabricated crosstalk is referred to herein as a compensation crosstalk. This idea is typically implemented by crossing the path of one of the conductors within the connector, over the path of another of the conductors within the connector twice, thereby providing two stages of NEXT compensation. This scheme is more efficient at reducing the NEXT than a scheme whereby the compensation is added at a single stage, especially when, as is usually the case, the compensation can not be introduced except after a time delay.

Although effective, the NEXT compensating scheme of the '358 patent suffers a drawback in that the NEXT margin relative to the Telecommunications Industry Association (TIA) limit line deteriorates at low frequency (below approximately 100 MHz) when a high crosstalk plug is used with the jack, and at high frequency (beyond approximately 250 MHz) when a low crosstalk plug is used with the jack. More specifically, when the net compensation crosstalk in a two-stage compensated jack is less than the original crosstalk (i.e. when a high crosstalk plug is inserted into the jack), the plug-jack combination is said to be under-compensated, and the resultant NEXT frequency characteristic will build-up to a peak at low frequencies before a null sets in at a frequency point determined by the inter-stage delays and the magnitudes of the compensating stages. In such a case, the NEXT margin relative to the TIA limit line is worst at low frequencies. On the other hand, when the net compensation crosstalk in such a jack is more than the original crosstalk (i.e. when a low crosstalk plug is inserted), the plug-jack combination is said to be over-compensated, and the resultant NEXT frequency characteristic will not have a null, but the slope of the NEXT frequency characteristic will gradually increase tending towards 60 dB/decade at very high frequencies, far exceeding the TIA limit slope of 20 dB/decade. In such a case, the NEXT margin relative to the TIA limit line is worst at high frequencies.

Thus, while the low frequency margin (low frequency performance of the connector), when a high crosstalk plug is used with the jack, can be improved by increasing the compensation level, such an action would lead to further deterioration of the high frequency margin (high frequency performance of the connector) when a low crosstalk plug is used with the jack. Conversely, while the high frequency margin, when a low crosstalk plug is used with the jack, can be improved by decreasing the compensation level, such an action would lead to further deterioration of the low frequency margin when a high crosstalk plug is used with the jack.

Therefore, there exists a need for a technique capable of simultaneously reducing or canceling NEXT at high frequencies such as at or above 250 MHz when low crosstalk plugs are used, and at low frequencies such as at or below 100 MHz when high crosstalk plugs are used.

SUMMARY OF THE INVENTION

The present invention overcomes the problems and limitations of the related art techniques of reducing NEXT in connectors. Particularly, the present invention provides an apparatus and method that simultaneously improves the NEXT high frequency performance when low crosstalk plugs are used, and the NEXT low frequency performance when high crosstalk plugs are used, by making different substrates of a multi-stage compensation system in materials having different dielectric frequency characteristics. Accordingly, the present invention improves both the low frequency (e.g., 1-100 MHz) crosstalk performance and the high frequency (e.g., 250-500 MHz; or 500 MHz and greater) crosstalk performance of modular outlets and panels.

BRIEF DESCRIPTION OF THE DRAWINGS

The aspects of the invention will be apparent from the following detailed description of the embodiments of the present invention with reference to the accompanying drawings, in which.

DETAILED DESCRIPTION OF THE PREFERRED EMBODIMENTS

Reference will now be made in detail to the preferred embodiments of the present invention, examples of which are illustrated in the accompanying drawings. In the present application, a 'stage' is referred to a place of compensation, which occurs at a compensation delay point.

The present invention provides various configurations of printed circuit boards (PCBs) which can replace the printed wiring board of FIG. 7A in the '358 patent. In some embodiments, the PCBs of the present invention are constructed by stacking multiple substrates having different dielectric constants (DK).

Figure 1A:
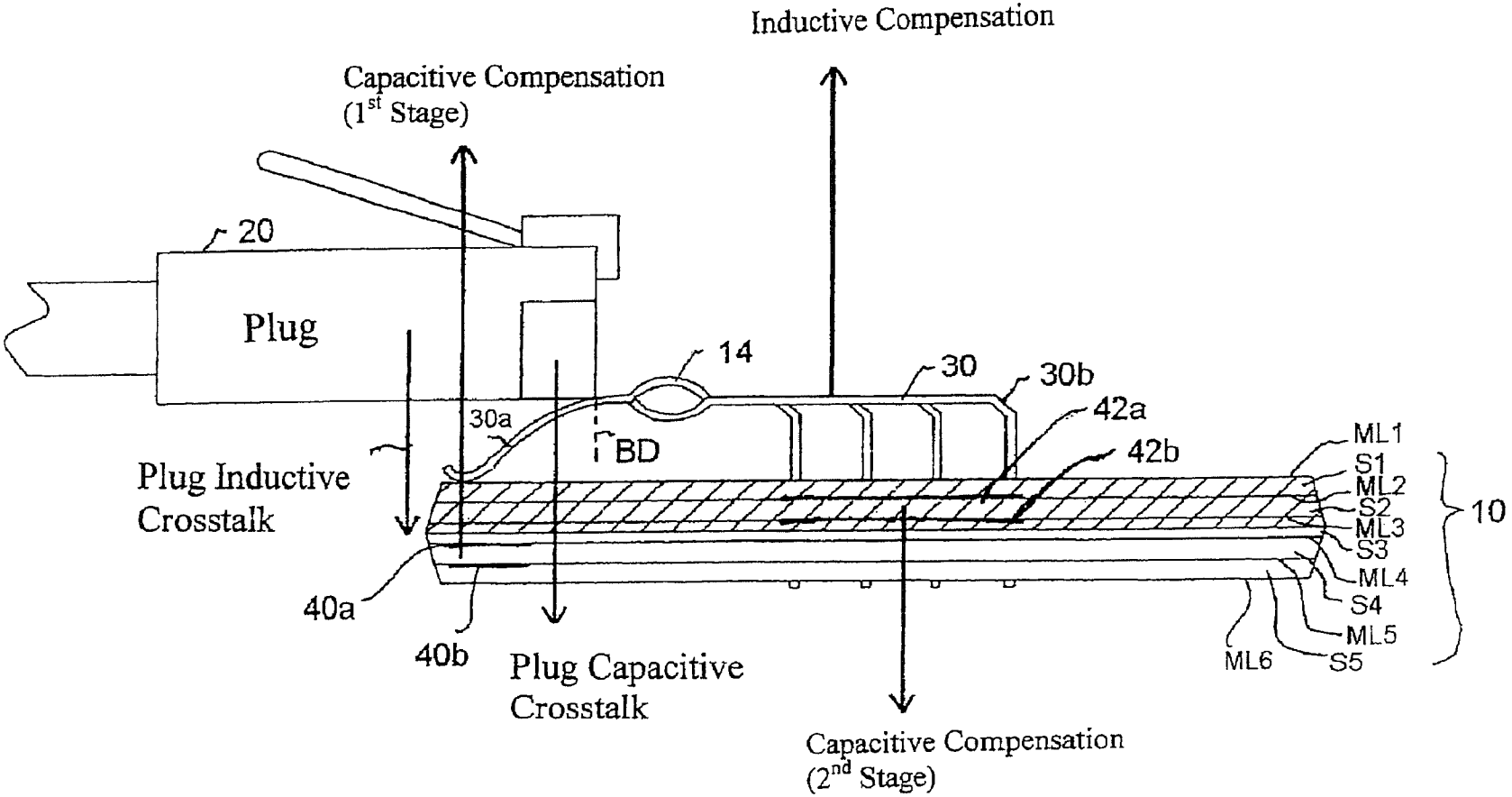
FIG. 1(a) is a side view of a connector according to a first embodiment of the present invention.
Figure 1B:
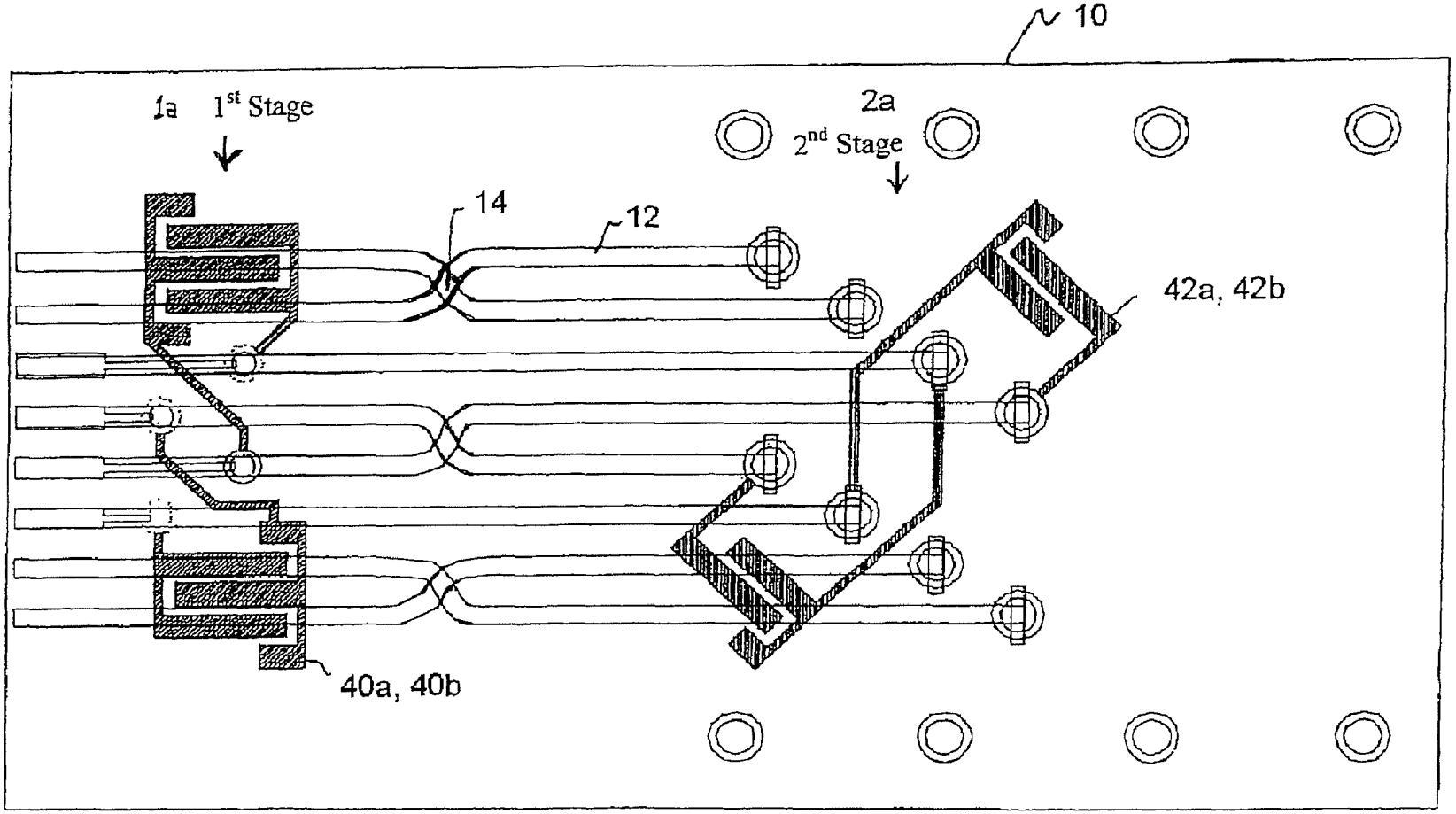
FIG. 1(b) is a top plan view of the printed circuit board and compensation capacitors of FIG. 1(a) according to the first embodiment of the present invention.

FIG. 1(a) is a side view of a connector and FIG. 1(b) is a top plan view of the printed circuit board and compensation capacitors of FIG. 1(a), all according to the first embodiment of the present invention.

Referring to FIGS. 1(a) and 1(b), the connector includes contacts 30 having crossovers 14, and a hybrid PCB 10, where a plug 20 is to mate with the connector. The plug 20 can be a modular plug such as one used at the end of a phone line or a patch cord used to connect a personal computer to a wall outlet. The contacts 30 can be soldered or press-fitted into plated-through holes located at the appropriate portions of the PCB 10 and can be spring wire contacts. Moreover, the contacts 30 have a current carrying portion 30b and a non-current carrying portion 30a, where a boundary BD between these portions 30a and 30b are indicated in FIG. 1(a). The contacts 30 and the PCB 10 can be housed in a housing such as a modular jack, so that when the plug 20 enters the jack, the electrical contacts on the plug 20 mate with the electrical contacts on the PCB 10 via the contacts 30.

The PCB 10 according to the first embodiment is composed of five substrates (S1-S5) and six metalized layers (ML1-ML6) alternatingly stacked up. More specifically, the substrates and the metalized layers are stacked up in the following order (from top to bottom): ML1, S1, ML2, S2, ML3, S3, ML4, S4, ML5, S5, and ML6. The first substrate S1, the second substrate S2, and a half/portion of the third substrate S3 are formed of a material having a low slope DK (i.e., a low rate of decline in dielectric constant with respect to frequency). A dielectric constant is a well-known term used to describe the ability of a material to store electrostatic energy. The other half/portion of the third substrate S3, the fourth substrate S4, and the fifth substrate S5 are formed of a material having a high slope DK (i.e., a high rate of decline in dielectric constant with respect to frequency). The use of the two different DK materials for the substrates S1-S5 is indicated by the presence and absence of hatched lines.

The metalized layers ML1-ML6 each represent metal conductive patterns formed on the upper surface of the substrate directly below the corresponding metalized layer. In FIG. 1(b), the contacts 30 having the cross-overs 14 as shown in FIG. 1(a) are indicated as, e.g., wire pairs 12 and are shown to be formed on the first metalized layer ML1. Interdigital capacitors 40a and 40b that act as first stage compensation capacitors are formed on or as part of the fourth and fifth metalized layers ML4 and ML5, respectively. Interdigital capacitors 42a and 42b that act as second stage compensation capacitors are formed on or as part of the second and third metalized layers ML2 and ML3, respectively. An interdigital capacitor is a capacitor having a co-planar arrangement of two inter-meshed metal combs each at a different potential, and is known.

In this embodiment, the capacitors 40a and 40b are duplicated on the layers ML4 and ML5, and the capacitors 42a and 42b are duplicated on the layers ML2 and ML3. In the present application, "duplicated"0 with respect to the compensation capacitors means identically copied on all the designated metalized layers. In other words, the capacitor 40a would have the identical shape and size as the capacitor 40b and would align with the capacitor 40b vertically. Similarly, the capacitor 42a would have the identical shape and size as the capacitor 42b and would align with the capacitor 42b vertically. The reason for duplicating the interdigital capacitors is to increase the capacitance without having to increase the foot-print (surface coverage). Also larger foot-print interdigital capacitors could be used without the need for this duplication. On the other hand, if the printed circuit board was constructed with more metalized layers, the interdigital capacitors can be duplicated on more than two metalized layers to make the foot-print even smaller if desired.

According to the present invention, the use of different DK materials for the substrates and the use of interdigital capacitors and cross-over wire pairs of the metalized layers reduce the NEXT introduced by the plug 20 at high frequencies if the plug 20 is a low crosstalk plug and at low frequencies if the plug 20 is a high crosstalk plug. An explanation on how this works is as follows.

NEXT is attributed to two factors: capacitive coupling and inductive coupling. The close proximity of two wires creates capacitive coupling, whereas the current flowing through these wires creates inductive coupling. Thus, the plug 20 introduces both the capacitive coupling and inductive coupling as it mates with the contacts 30, and thereby generates NEXT.

To reduce or compensate for the NEXT caused by the inductive coupling, the wire pairs 12 (contacts 30) have the cross-overs 14. This is known and disclosed in the '358 patent.

To reduce or compensate for the NEXT caused by the capacitive coupling, the PCB 10 includes capacitive compensation factors at two stages. In FIGS. 1(a) and 1(b), the first stage is at a minimal delay from the original crosstalk, being at a portion of the PCB 10 where electrically it is directly connected, via the non-current carrying portion 30a of the contacts 30, to where the contacts of the plug 20 intercept the contacts 30. The second stage is at some delay from the first stage, being at a portion of the PCB 10, which is removed from where the contacts of the plug 20 intercept the contacts 30 via the current carrying portion 30b of the contacts 30.

In the various embodiments of the present invention, the interdigital or parallel plate capacitors are placed on the metalized layers associated with the substrate(s) made of a high slope DK material at the first stage. A parallel plate capacitor is a capacitor composed of two parallel metal plates each at a different potential, and is known. At the second stage, the interdigital or parallel plate capacitors are placed on the metalized layers associated with the substrate(s) made of a low slope DK material. For instance, in the first embodiment, since the substrates S4 and S5 are made of a high slope DK material, the interdigital capacitors 40a and 40b are respectively placed on the metalized layers ML4 and ML5 at the first stage area. Also since the substrates S1 and S2 are made of a low slope DK material, the interdigital capacitors 42a and 42b are respectively placed on the metalized layers ML2 and ML3 at the second stage area.

In the present invention, the magnitude of the first stage capacitive coupling is made to decline with frequency by placing the first stage interdigital capacitors (or other types of capacitors) in the PCB substrates having a high DK slope. The second stage capacitive coupling, on the other hand, is made relatively flat with frequency by placing the second stage interdigital capacitors (or other types of capacitors) in the PCB substrates having a low DK slope. As a result, the net compensation crosstalk (fabricated crosstalk) of the connector, which is comprised of the first stage compensation crosstalk minus the second stage compensation crosstalk, declines with frequency (i.e., with the increase of frequency). In other words, the net compensation crosstalk becomes variable depending on the frequency, such that the present invention provides a low-level compensation crosstalk at a high frequency to minimize the crosstalk over-compensation in the connector and provides a high-level compensation crosstalk at a low frequency to minimize the crosstalk under-compensation in the connector. By providing the low-level compensation crosstalk at a high frequency, the present invention improves the high frequency margin of the connector when a low crosstalk plug is inserted into the jack. On the other hand, by providing the high-level compensation crosstalk at a low frequency, the present invention improves the low frequency margin of the connector when a high crosstalk plug is inserted into the jack.

Figure 2:
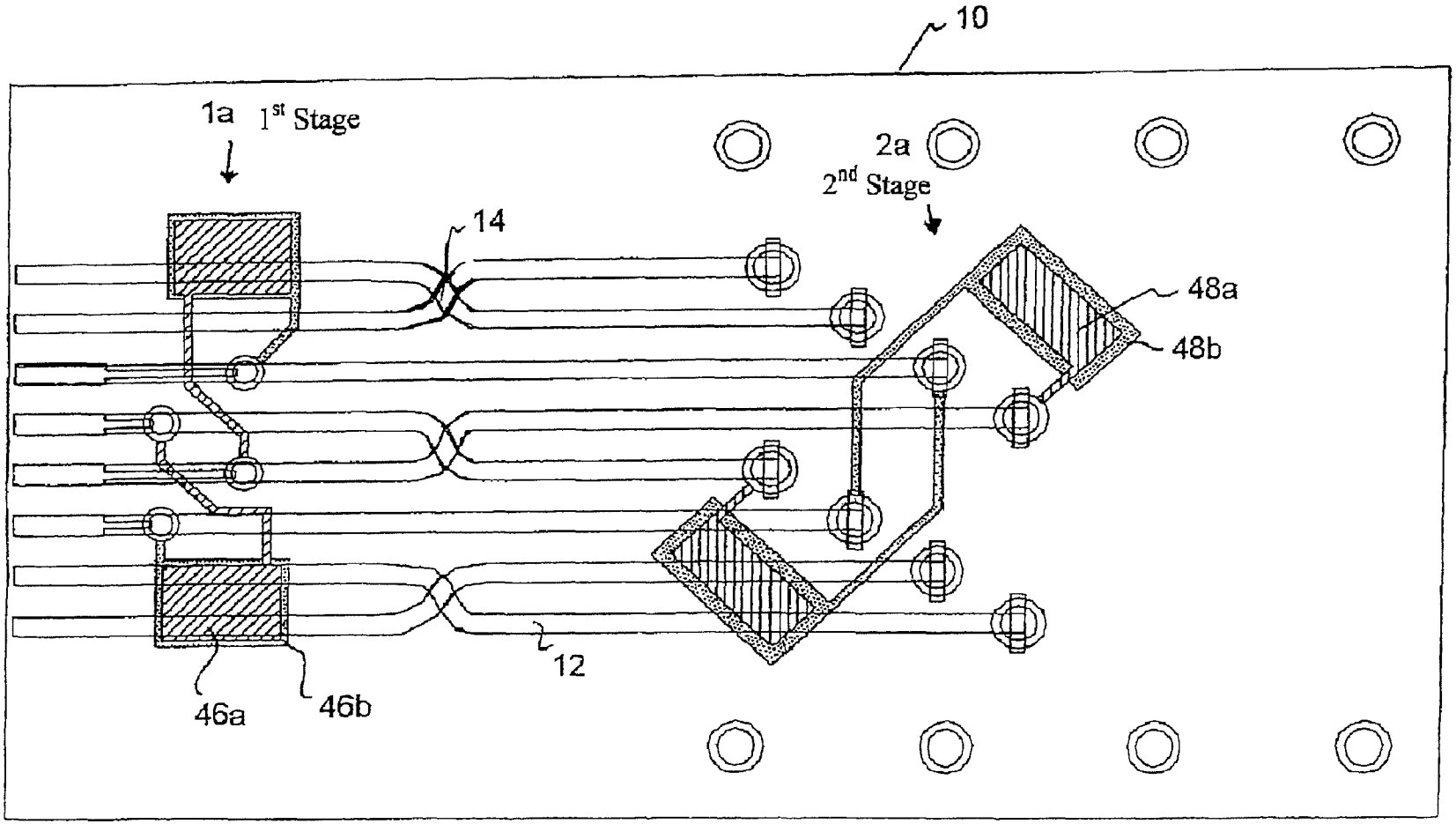
FIG. 2 is a top plan view of a printed circuit board and compensation capacitors of a connector according to a second embodiment of the present invention.

FIG. 2 is a top plan view of the printed circuit board and compensation capacitors of FIG. 1(a) according to the second embodiment of the present. The second embodiment is identical to the first embodiment, except that different types of compensation capacitors are used. That is, the first stage compensation capacitors are implemented using parallel plate capacitors 46a and 46b, and the second stage compensation capacitors are implemented using parallel plate capacitors 48a and 48b. The parallel plate capacitors 46a and 46b are respectively formed on the metalized layers ML4 and ML5, and the parallel plate capacitors 48a and 48b are respectively formed on the metalized layers ML2 and ML3 of FIG. 1(a). As a result, the second embodiment operates in the same manner as the first embodiment with the same benefits as discussed above.

Figure 3A:
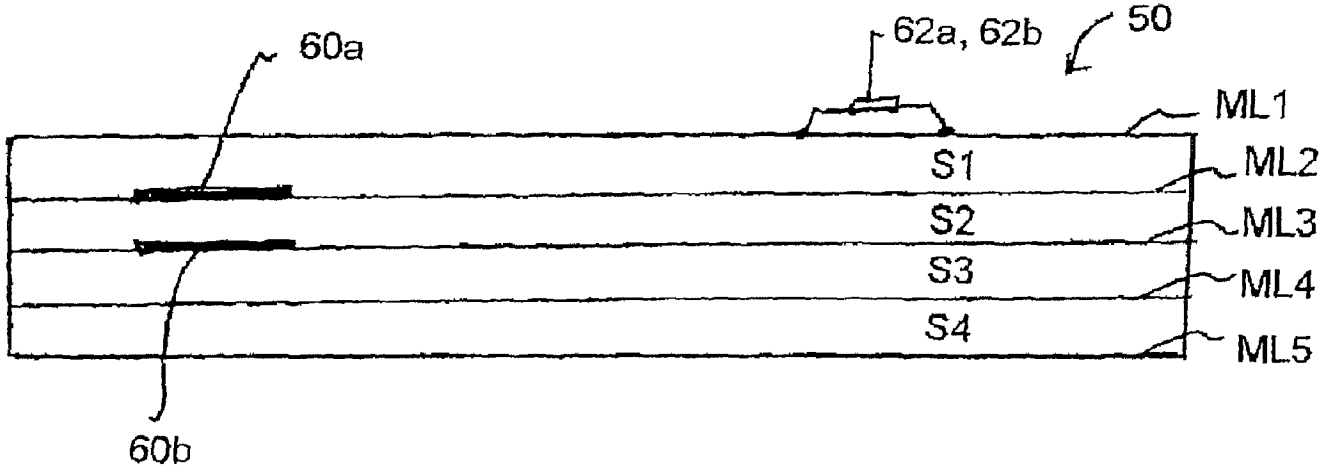
FIG. 3(a) is a side view of a printed circuit board of a connector according to a third embodiment of the present invention.
Figure 3B:
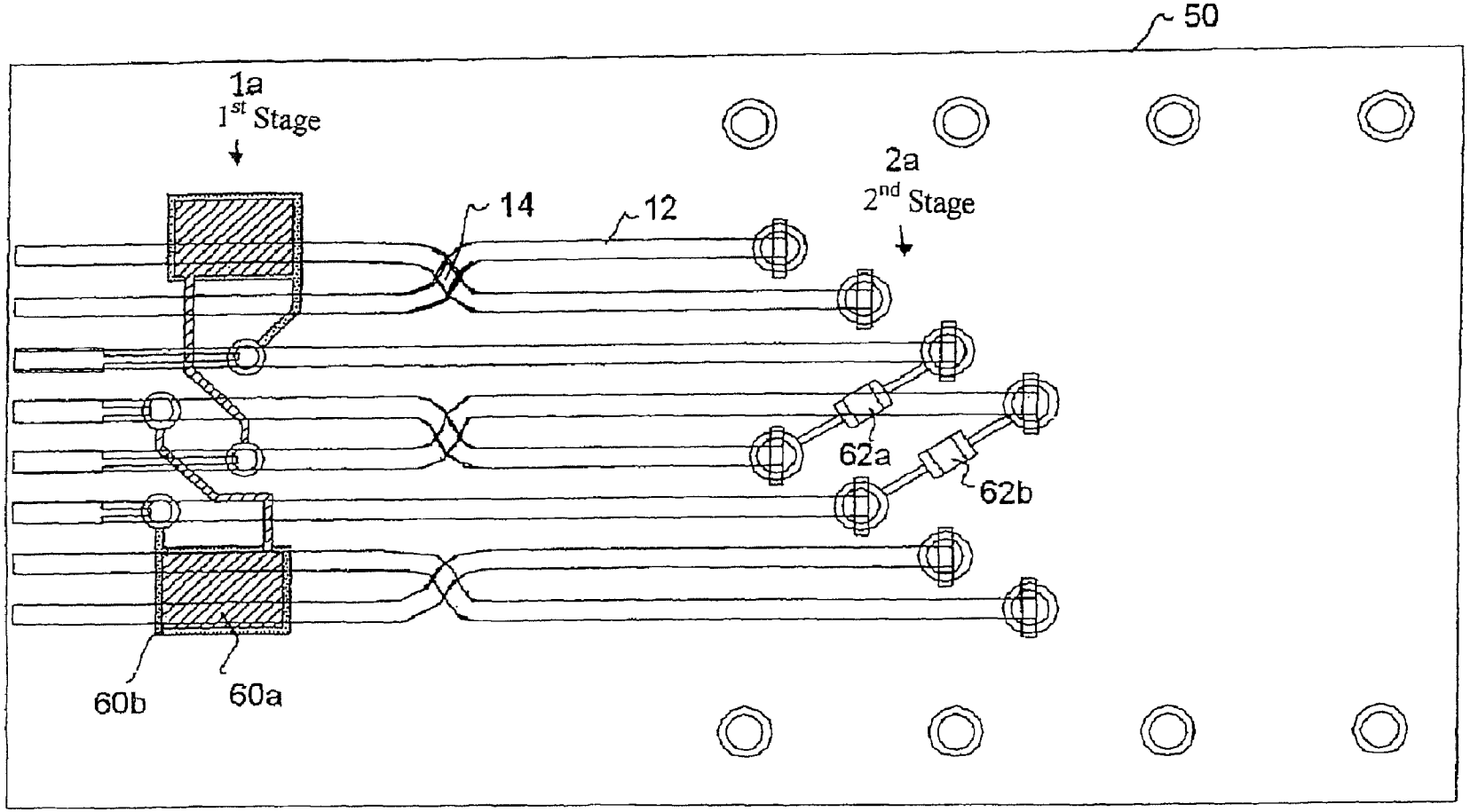
FIG. 3(b) is a top plan view of the printed circuit board and compensation capacitors of FIG. 3(a) according to the third embodiment of the present invention.

FIG. 3(a) is a side view of a printed circuit board of a connector and FIG. 3(b) is a top plan view of the printed circuit hoard and compensation capacitors of FIG. 3(a), all according to the third embodiment of the present invention. The third embodiment is similar to the first embodiment in that the connector includes the contacts 30 and a PCB and receives a plug such as the plug 20. However, instead of using the hybrid PCB 10 made of high slope and low slope DK materials as in the first embodiment, in the third embodiment a homogeneous PCB 50 is used where all the substrates of the PCB are made of a high slope DK material. Also, instead of integrating the capacitors in the PCB by the use of interdigital or parallel plate capacitors, surface mount type capacitors may be used at the second stage area.

Particularly, referring to FIG. 3(a), the PCB 50 according to the third embodiment is composed of four substrates S1-S4 and five metalized layers ML1-ML5, which are alternatingly stacked up. All the four substrates S1-S4 are made of a high DK material. The contacts 30 on the first metalized layer ML1 are not shown in FIG. 3(a), but are shown in FIG. 3(b) as the wire pairs 12 having the crossovers 14.

Referring to FIG. 3(b), at the first stage, parallel plate capacitors 60a and 60b are respectively formed on or as part of the second and third metalized layers ML2 and ML3, where the two plates 60a and 60b of each capacitor parallel each other. At the second stage, surface mount capacitors 62a and 62b are mounted on the first metalized layer ML1 (or under the last metalized layer).

In this embodiment, the magnitude of the first stage capacitive coupling declines with frequency because the first stage parallel plate capacitors 60a and 60b reside in the PCB 50, which has a high DK slope. The second stage capacitive coupling, on the other hand, is relatively flat with frequency since it is implemented using the discreet surface mount capacitors. As a result, the net compensation crosstalk, which is comprised of the first stage compensation crosstalk minus the second stage compensation crosstalk, declines with frequency. By providing a low-level compensation crosstalk at a high frequency, the present invention improves the high frequency margin of the connector when a low crosstalk plug is inserted into the jack. On the other hand, by providing a high-level compensation crosstalk at a low frequency, the present invention improves the low frequency margin of the connector when a high crosstalk plug is inserted into the jack.

Figure 4A:
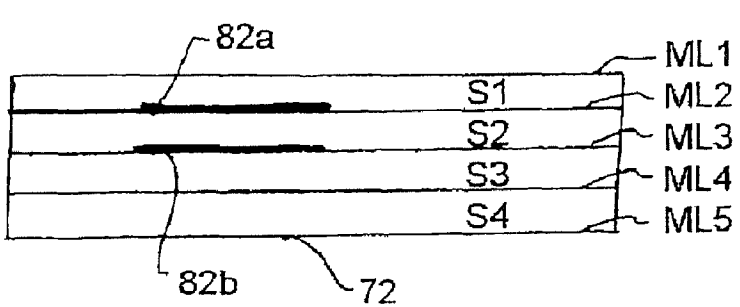
FIG. 4(a) is a side view of printed circuit boards of a connector according to a fourth embodiment of the present invention.
Figure 4A:
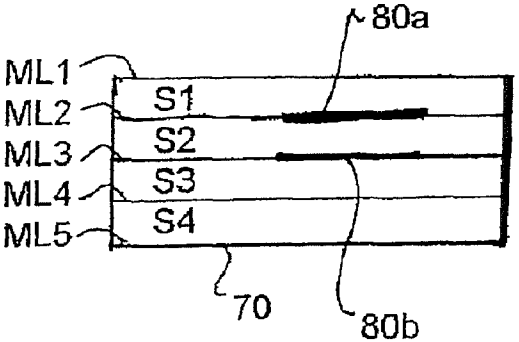
Figure 4B:
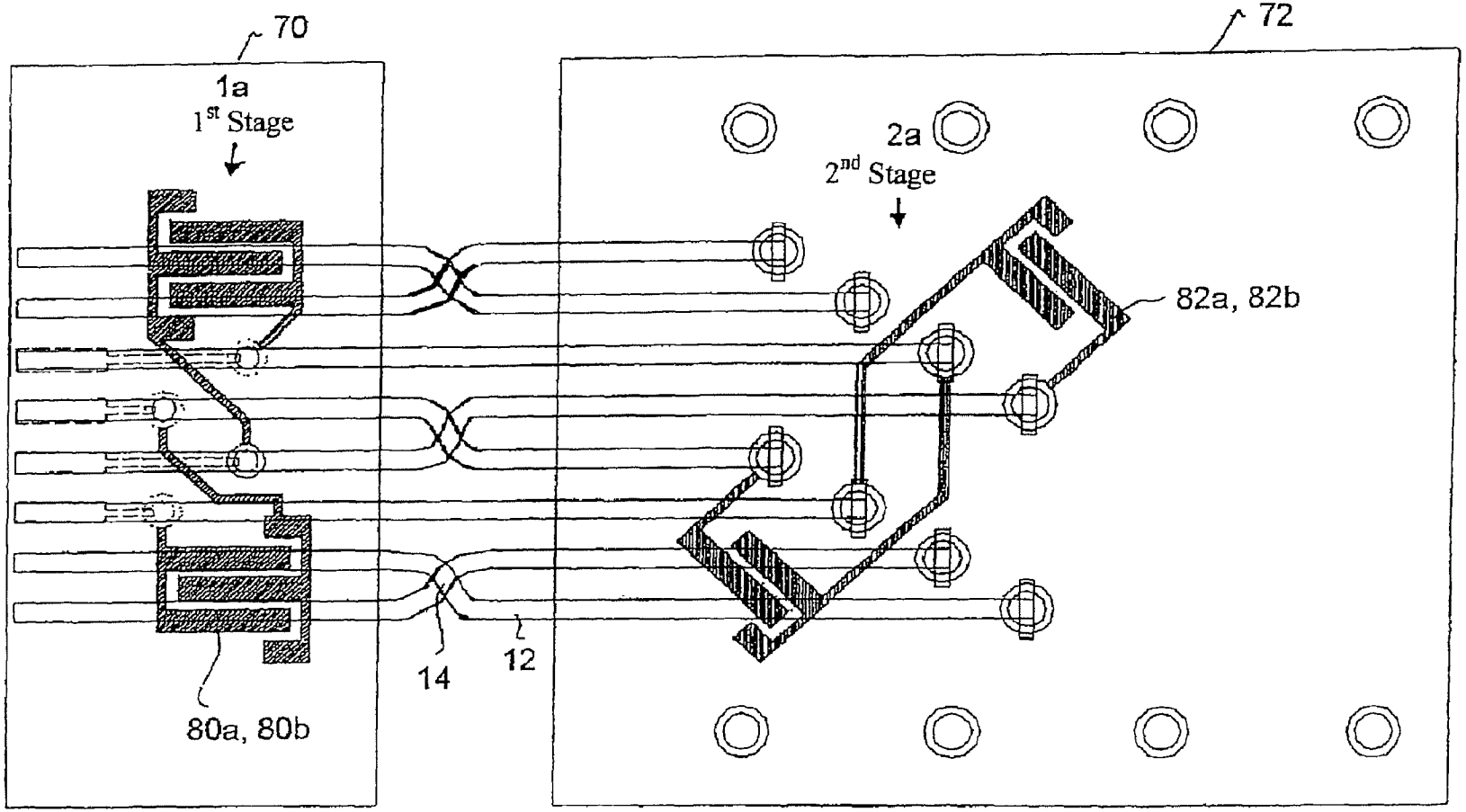
FIG. 4(b) is a top plan view of the printed circuit boards and compensation capacitors of FIG. 4(a) according to the fourth embodiment of the present invention.

FIG. 4(a) is a side view of printed circuit boards of a connector and FIG. 4(b) is a top plan view of the printed circuit boards and compensation capacitors of FIG. 4(a), all according to the fourth embodiment of the present invention.

The fourth embodiment is similar to the first embodiment in that the connector includes the contacts 30 and receives a plug such as the plug 20. However, instead of using one hybrid PCB 10 made of high and low DK materials as in the first embodiment, in the fourth embodiment two homogenous PCBs are provided in the connector, where all the substrates of the first PCB are made of a high slope DK material and all the substrates of the second PCB are made of a low slope DK material.

Particularly, referring to FIG. 4(a), in the fourth embodiment, the first PCB 70 is composed of four substrates S1-S4 and five metalized layers ML1-ML5, which are alternatingly stacked up. All the four substrates S1-S4 in the first PCB 70 are made of a high slope DK material. The second PCB 72 is composed of four substrates S1-S4 and five metalized layers ML1-ML5, which are alternatingly stacked up. All the four substrates S1-S4 in the second PCB 72 are made of a low slope DK material. The contacts 30 on the first metalized layer ML1 are not shown in FIG. 4(a), but are shown in FIG. 4(b) as the wire pairs 12 having the cross-overs 14.

Referring to FIG. 4(b), at the first stage, capacitors 80a and 80b are interdigital capacitors formed respectively on or as part of the second and third metalized layers ML2 and ML3 of the first PCB 70. At the second stage, capacitors 82a and 82b are interdigital capacitors formed respectively on or as part of the second and third metalized layers ML2 and ML3 of the second PCB 72.

In this embodiment, the magnitude of the first stage capacitive coupling declines with frequency because the first stage interdigital capacitors reside in the PCB 70, which has a high DK slope. The second stage capacitive coupling, on the other hand, is rather flat with frequency since the second stage interdigital capacitors reside in the PCB 72, which has a low DK slope. As a result, the net compensation crosstalk, which is comprised of the first stage compensation crosstalk minus the second stage compensation crosstalk, declines with frequency. By providing a low-level compensation crosstalk at a high frequency, the present invention improves the high frequency margin of the connector when a low crosstalk plug is inserted into the jack. On the other hand, by providing a high-level compensation crosstalk at a low frequency, the present invention improves the low frequency margin of the connector when a high crosstalk plug is inserted into the jack.

Figure 5:
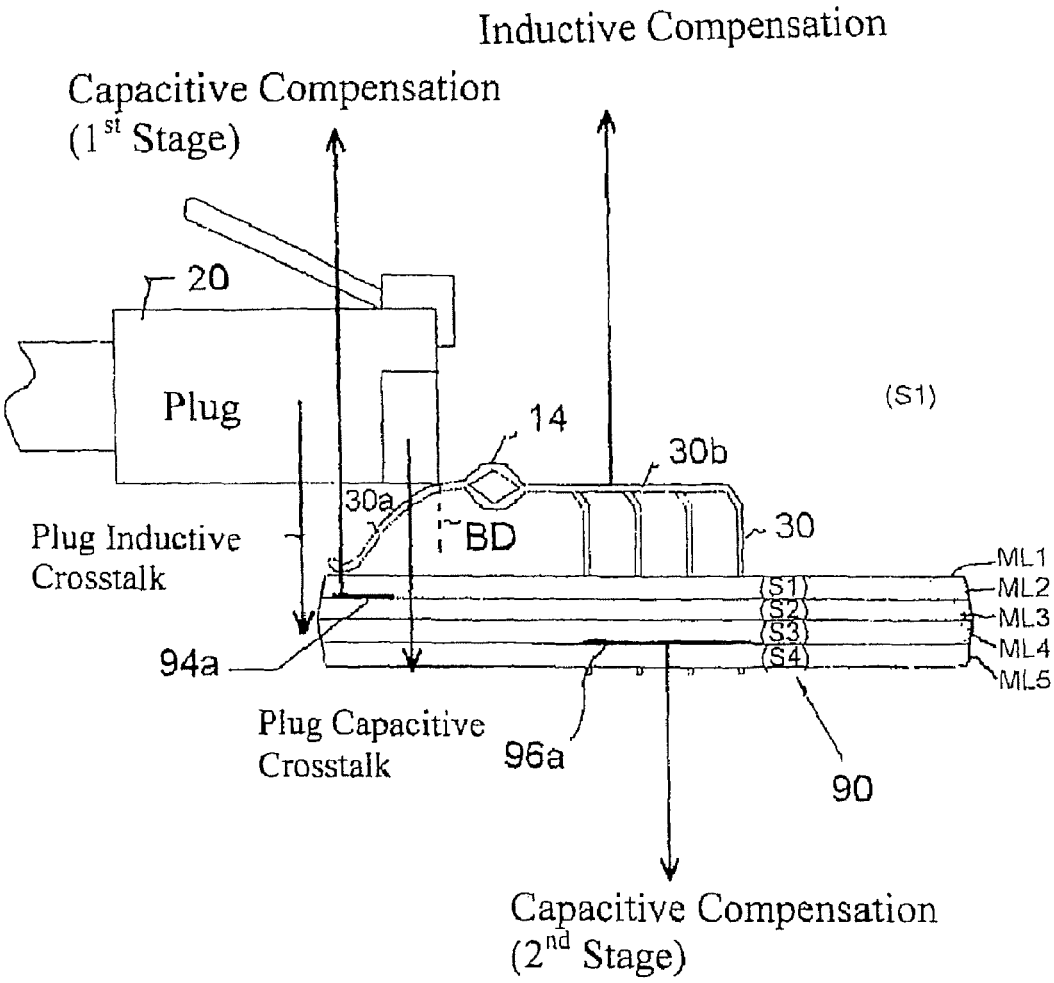
FIG. 5 is a side view of a connector according to a fifth embodiment of the present invention.

FIG. 5 is a side view of a connector according to the fifth embodiment of the present invention. The fifth embodiment is similar to the first embodiment in that the connector includes the contacts 30 and a PCB and receives a plug such as the plug 20. However, instead of having five substrates in the PCB, a PCB 90 in the fifth embodiment has four substrates.

Particularly, referring to FIG. 5, the hybrid PCB 90 is composed of four substrates S1-S4 and five metalized layers ML1-ML5 alternatingly stacked up. The first and second substrates S1 and S2 are made of a high slope DK material, whereas the third and fourth substrates S3 and S4 are made of a low slope DK material. At the first stage, an interdigital capacitor 94a is formed on or as part of the metalized layer ML2. At the second stage, an interdigital capacitor 96a is formed on or as part of the metalized layer ML4.

In this embodiment, the magnitude of the first stage capacitive coupling declines with frequency because the first stage interdigital capacitor resides between the substrates S1 and S2, which have a high DK slope. The second stage capacitive coupling, on the other hand, does not significantly decline with frequency since the second stage interdigital capacitor reside between the substrates S3 and S4, which have a low DK slope. As a result, the net compensation crosstalk, which is comprised of the first stage compensation crosstalk minus the second stage compensation crosstalk, declines with frequency. By providing a low-level compensation crosstalk at a high frequency, the present invention improves the high frequency margin of the connector when a low crosstalk plug is inserted into the jack. On the other hand, by providing a high-level compensation crosstalk at a low frequency, the present invention improves the low frequency margin of the connector when a high crosstalk plug is inserted into the jack.

In the various embodiments of the present invention, preferably the high slope DK material used in the PCB substrates has a dielectric constant of at or about 4.0 at 1 MHz with a rate of decline being 0.4 per decade of frequency between 1 MHz and 1 GHz. The low slope DK material used in the PCB substrates preferably has a dielectric constant of at or about 4.0, which should remain flat across the frequency range of 1 MHz and 1 GHz. As an example, materials such as FR-4 and/or Teflon can be used as the PCB substrates. Other commercially available high and low slope DK materials can be used. For instance, Nelco N4000-7 is an example of a high slope DK material usable in the PCB substrates of the present invention, and Nelco N4000-13 SI is an example of a low DK slope material usable in the PCB substrates of the present invention Nelco N4000-7 has a dielectric constant of 4.5 at 1 MHz and 3.9 at 1 GHZ (e.g. a rate of decline of about 0.2 per decade of frequency across the frequency range of 1 MHz to 1 GHz), whereas Nelco N4000-13 SI has a dielectric constant of 3.6 at 1 MHz and 3.5 at 1 GHz. Also, if needed, the dielectric constant level of these materials can be easily adjusted by known techniques. As such, a material having the dielectric constant in the range of about 3.0 to 5.0 at 1 MHz can be used. Obviously other materials may be used.

Generally, the dielectric constant (DK) of most printed circuit board materials declines with frequency. In the conventional 2-stage compensated systems, the effect of this decline has been largely diluted by the deployment of oppositely polarized first and second compensation stages on same material substrates. This subjects the first and second stages to the same rate of decline in DK. The present invention deliberately uses a material having a very steep DK rate of decline in the first stage and uses a material having a very low DK rate of decline in the second stage. This biases the resultant capacitive coupling in such a way as to reduce the overall level of compensation as the frequency increases, thus improving the high frequency NEXT performance.

Although four or five PCB substrates are illustrated, it should be readily apparent that any other number of PCB substrates and/or metalized layers may be used for the PCB(s). An important aspect is that there is a big difference in the DK slope, when comparing the material used to make the low slope DK substrates versus the high slope DK substrates. A difference between the high DK slope and the low DK slope can be in the range of 0.15 to 0.45 per decade of frequency.

By having two different DK slope materials, the connector designer has a greater flexibility to tailor/enhance the capacitor values to better suppress NEXT at the connector. Further, the stages of the NEXT suppression can be placed on/between substrates having very different DK slopes. The resultant connector of the present invention can be associated with housings, insulation displacement connectors, jack spring contacts, etc.

Also, the various configurations and features of the above embodiments may be combined or replaced with those of other embodiments. For instance, the parallel plate capacitors 60a, 60b in FIG. 3(b) can be replaced with interdigital capacitors. The interdigital capacitors 80a, 80b, 82a, 82b in FIG. 4(b) can be replaced with parallel plate capacitors. Wherever the interdigital capacitors are used, such capacitors can be duplicated with respect to the corresponding other interdigital capacitors. In one connector, some of the interdigital capacitors can be implemented on a single metalized layer or on several metalized layers. Further, as mentioned above, any number of metalized layers/substrates for one or more PCBs may be used; the location of the high and/or low slope DK material may vary; the location of compensation capacitors may vary according to the use and location of the high and/or low DK slope material; and different types of capacitors (e.g., parallel plate, interdigital, surface mount, etc.) may be used.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention.

What is claimed is:

1. A printed circuit board for providing crosstalk compensation in an electrical connector comprising:

a plurality of contacts for electrical connection with a mating connector, said plurality of contacts being mounted to said printed circuit board;

a first stage of compensation including a first capacitor having a first dielectric with a first dielectric constant that has a first rate of change with frequency;

a first conductive path electrically connecting said first capacitor to a portion of a first contact of said plurality of contacts, which portion is intended to make electrical contact with the mating connector;

a second stage of compensation including a second capacitor having a second dielectric with a second dielectric constant that has a second rate of change with frequency different than said first dielectric by at least about 0.15 across a decade of frequency; and a second conductive path electrically connecting said second capacitor to said portion of said first contact of said plurality of contacts.

2. The printed circuit board of claim 1, wherein said plurality of contacts are spring wire contacts.

3. The printed circuit board of claim 1, wherein said first capacitor is an interdigital capacitor.

4. The printed circuit board of claim 1, wherein said first capacitor is a plate capacitor.

5. The printed circuit board of claim 1, wherein said second capacitor is a component that is surface mounted to said printed circuit board.

6. The printed circuit board of claim 1, wherein said first capacitor and said second capacitor are connected to said printed circuit board.

7. The printed circuit board of claim 6, wherein said printed circuit board includes multiple stacked substrates, and wherein said first capacitor is formed on one or more surfaces of said multiple stacked substrates.

8. The printed circuit board of claim 7, wherein said first capacitor is an interdigital capacitor.

9. The printed circuit board of claim 7, wherein said first capacitor is a plate capacitor.

10. The printed circuit board of claim 7, wherein said second capacitor is a component that is surface mounted to said printed circuit board.

11. The printed circuit board of claim 6, wherein said printed circuit board includes multiple stacked substrates, wherein a first substrate of said multiple stacked substrates serves as said first dielectric with said first dielectric constant, and wherein a second substrate of said multiple stacked substrates serves as said second dielectric with said second dielectric constant.

12. The printed circuit board of claim 11, wherein said printed circuit board includes four stacked substrates, two substrates having said first dielectric constant and two other substrates having said second dielectric constant.

13. The printed circuit board of claim 11, wherein said printed circuit board includes five stacked substrates, two substrates having said first dielectric constant and two other substrates having said second dielectric constant, and a fifth substrate having a first portion with said first dielectric constant and a second portion with said second dielectric constant.

14. The printed circuit board of claim 1, wherein said printed circuit board is includes a first circuit board portion and a separate second circuit board portion, wherein said first capacitor is connected to said first circuit board portion and wherein said second capacitor is connected to said second circuit board portion.

15. The printed circuit board of claim 14, wherein said first circuit board portion includes multiple stacked first substrates, wherein at least one of said stacked first substrates serves as said first dielectric with said first dielectric constant, wherein said second circuit board portion includes multiple stacked second substrates, and wherein at least one of said stacked second substrates serves as said second dielectric with said second dielectric constant.

16. The printed circuit board of claim 1, wherein said plurality of contacts extend away from said printed circuit board, and include at least one crossover, where an ordering of said plurality of contacts is changed prior to free ends of said plurality of contacts.

17. The printed circuit board of claim 1, wherein said plurality of contacts have fixed ends mounted to said printed circuit board and free ends opposite said fixed ends, and wherein said first conductive path passes through said free end of said first contact of said plurality of contacts.

18. The printed circuit board of claim 17, wherein said second conductive path passes through said fixed end of said first contact of said plurality of contacts.

19. The printed circuit board of claim 1, further comprising: a modular jack housing for housing at least a portion of said plurality of contacts, said modular jack housing having an opening for receiving the mating connector.

20. The printed circuit board of claim 1, wherein said second dielectric is lower in rate of decline with frequency than said first dielectric.

21. The printed circuit board of claim 1 wherein said first dielectric constant is about 4.0 at 1 MHz with a rate of decline being about 0.4 per decade of frequency between 1 MHz and 1 GHz.

22. The printed circuit board of claim 21, wherein said second dielectric constant is about 4.0 at 1 MHz and remains constant across a frequency range of 1 MHz to 1 GHz.

23. The printed circuit board of claim 1, wherein said second dielectric constant is about 4.0 at 1 MHz and remains constant across a frequency range of 1 MHz to 1 GHz.

24. The printed circuit board of claim 1, wherein said first dielectric constant is in the range of 3.0 to 5.0 at 1 MHz with a rate of decline being about 0.4 per decade of frequency between 1 MHz and 1 GHz.

25. The printed circuit board of claim 24, wherein said second dielectric constant is in the range of 3.0 to 5.0 at 1 MHz and remains constant across a frequency range of 1 MHz to 1 GHz.

26. The printed circuit board of claim 1, wherein said second dielectric constant is in the range of 3.0 to 5.0 at 1 MHz and remains constant across a frequency range of 1 MHz to 1 GHz.

27. The printed circuit board of claim 1, wherein the difference in the decline rate of said first dielectric and said second dielectric is in the range of 0.15 to 0.45 per decade of frequency.

28. The printed circuit board of claim 1, wherein said first stage of compensation further includes a third capacitor having said first dielectric with said first dielectric constant, and said second stage of compensation includes a fourth capacitor having said second dielectric with said second dielectric constant, further comprising:

a third conductive path electrically connecting said third capacitor to a portion of a second contact of said plurality of contacts, which portion is intended to make electrical contact with the mating connector; and a fourth conductive path electrically connecting said fourth capacitor to said portion of said second contact of said plurality of contacts, wherein said fourth conductive path is longer than said third conductive path.

29. The printed circuit board of claim 28, wherein said plurality of contacts have fixed ends mounted to said printed circuit board and free ends opposite said fixed ends, and wherein said third conductive path passes through said free end of said second contact of said plurality of contacts.

30. The printed circuit board of claim 29, wherein said fourth conductive path passes through said fixed end of said second contact of said plurality of contacts.

31. The printed circuit board of claim 28, further comprising:

a fifth conductive path electrically connecting said first capacitor to a portion of a third contact of said plurality of contacts, which portion is intended to make electrical contact with the mating connector; and a sixth conductive path electrically connecting said second capacitor to said portion of said third contact of said plurality of contacts, wherein said sixth conductive path is longer than said fifth conductive path;

a seventh conductive path electrically connecting said third capacitor to a portion of a fourth contact of said plurality of contacts, which portion is intended to make electrical contact with the mating connector; and a eighth conductive path electrically connecting said fourth capacitor to said portion of said fourth contact of said plurality of contacts, wherein said eighth conductive path is longer than said seventh conductive path.

32. The printed circuit board of claim 31, wherein said plurality of contacts have fixed ends mounted to said printed circuit board and free ends opposite said fixed ends, wherein said first conductive path passes through said free end of said first contact of said plurality of contacts, wherein said third conductive path passes through said free end of said second contact of said plurality of contacts, wherein said fifth conductive path passes through said free end of said third contact of said plurality of contacts, and wherein said seventh conductive path passes through said free end of said fourth contact of said plurality of contacts.

33. The printed circuit board of claim 32, wherein said second conductive path passes through said fixed end of said first contact of said plurality of contacts, wherein said fourth conductive path passes through said fixed end of said second contact of said plurality of contacts, wherein said sixth conductive path passes through said fixed end of said third contact of said plurality of contacts, and wherein said eighth conductive path passes through said fixed end of said fourth contact of said plurality of contacts.

34. The printed circuit board of claim 1, wherein said second conductive path is longer than said first conductive path.

35. A printed circuit board for providing crosstalk compensation in an electrical connector, the printed circuit board comprising:

a plurality of conductors;

a first capacitor electrically connected to a first of the conductors and providing crosstalk compensation to a signal communicated on the first of the conductors, the first capacitor having a first dielectric with a first dielectric constant slope; and a second capacitor electrically connected to the first of the conductors and providing crosstalk compensation to the signal communicated on the first of the conductors, the second capacitor having a second dielectric with a second dielectric constant slope, different than the first dielectric constant slope.

36. The printed circuit board of claim 35, wherein the first dielectric constant slope or the second dielectric constant slope is substantially constant across the frequency range of about 1 MHz to about 1 GHz.

37. The printed circuit board of claim 35, wherein the first dielectric constant slope is about 0.2 per decade of frequency across the frequency range of 1 MHz to 1 GHz.

38. The printed circuit board of claim 35, wherein the first dielectric constant slope is about 0.4 per decade of frequency across the frequency range of 1 MHz to 1 GHz.

39. A printed circuit board comprising:

a plurality of conductive paths that extend from a plurality of respective inputs of said printed circuit board to a plurality of respective outputs of said printed circuit board;

a first compensation stage for capacitively coupling crosstalk compensation having a first polarity onto a first path of said plurality of conductive paths, said first compensation stage including at least one first capacitive element that includes a first dielectric constant material that has a first rate of change with frequency; and a second compensation stage for capacitively coupling crosstalk compensation having a polarity opposite the first polarity onto said first path of said plurality of conductive paths, said second compensation stage including at least one second capacitive element that includes a second dielectric constant material that has a second rate of change with frequency, different than the first rate of change with frequency.

40. The printed circuit board of claim 39, wherein the first rate of change is about 0.2 per decade of frequency across the frequency range of 1 MHz to 1 GHz.

41. The printed circuit board of claim 39, wherein the first rate of change is about 0.4 per decade of frequency across the frequency range of 1 MHz to 1 GHz.

42. The printed circuit board of claim 39, wherein the second rate of change is substantially flat with frequency across the frequency range of 1 MHz to 1 GHz.

43. The printed circuit board of claim 39, wherein the first and second rates of change are pre-selected to reduce the near-end crosstalk on said first path of said plurality of conductive paths in the 1 MHz to 100 MHz frequency range when a high crosstalk plug is electrically connected to said plurality of respective inputs, and to reduce the near-end crosstalk on said first path of said plurality of conductive paths at frequencies above 250 MHz when a low crosstalk plug is electrically connected to said plurality of respective inputs.

*44. A printed circuit board comprising:*

*a plurality of conductors;*

*a first compensation structure that is configured to provide a first compensating crosstalk having a first magnitude to a first of the plurality of conductors; and*

*a second compensation structure that is configured to provide a second compensating crosstalk having a second magnitude to the first of the plurality of conductors;*

*wherein a ratio of the first magnitude to the second magnitude varies with frequency.*

*45. The printed circuit board of claim 44, wherein the printed circuit board includes a first printed circuit board portion and a second printed circuit board portion that is separate from the first printed circuit board portion, and wherein the first printed circuit board portion includes the first compensation structure and the second printed circuit board portion includes the second compensation structure.*

*46. The printed circuit board of claim 45, wherein the first compensation structure is at a first delay from a point where the conductors of the electrical connector intercept conductors of a mating plug connector and the second compensation structure is at a second delay from the point where the conductors of the electrical connector intercept conductors of the mating plug connector, where the first delay is less than the second delay.*

*47. The printed circuit board of claim 46, wherein the first compensation structure includes a parallel plate capacitor.*

*48. The printed circuit board of claim 47, wherein the first printed circuit board portion includes a first dielectric material that has a first dielectric constant that has a first rate of change with frequency, and the second printed circuit board portion includes a second dielectric material that has a second dielectric constant that has a second rate of change with frequency that is different than the first rate of change with frequency.*

*49. The printed circuit board of claim 48, wherein the first rate of change with frequency is higher than the second rate of change with frequency.*

*50. The printed circuit board of claim 1, wherein the printed circuit board includes a first printed circuit board portion and a separate second printed circuit board portion, and wherein the first printed circuit board portion includes the first stage of compensation and the second printed circuit board portion includes the second stage of compensation.*

*51. The printed circuit board of claim 35, wherein the printed circuit board includes a first printed circuit board portion and a separate second printed circuit board portion, and wherein the first printed circuit board portion includes the first capacitor and the second printed circuit board portion includes the second capacitor.*

*52. The printed circuit board of claim 44, wherein the printed circuit board comprises a unitary printed circuit board structure and the first compensation structure and the second compensation structure are both on the unitary printed circuit board structure.*

* * * * *

UNITED STATES PATENT AND TRADEMARK OFFICE

CERTIFICATE OF CORRECTION

PATENT NO. : RE43,510 E
APPLICATION NO. : 12/793052
DATED : July 17, 2012
INVENTOR(S) : Adriaenssens et al.

It is certified that error appears in the above-identified patent and that said Letters Patent is hereby corrected as shown below:

In the Claims:

Column 9, Claim 14, Line 50: Please correct "circuit board is includes"
to read -- circuit board includes --

Signed and Sealed this
Eighth Day of January, 2013

David J. Kappos

David J. Kappos
*Director of the United States Patent and Trademark Office*